United States Patent [19]
Nakamura et al.

[11] Patent Number: 5,567,555
[45] Date of Patent: Oct. 22, 1996

[54] METHOD FOR MANUFACTURING SHADOW MASK AND SHADOW MASK MANUFACTURED BY SAID METHOD

[75] Inventors: Osamu Nakamura; Takeshi Ikegami, both of Tokyo, Japan

[73] Assignee: Dai Nippon Printing Co., Ltd., Tokyo, Japan

[21] Appl. No.: 221,058

[22] Filed: Mar. 29, 1994

Related U.S. Application Data

[62] Division of Ser. No. 908,194, Jul. 1, 1992, Pat. No. 5,348,825.

[30] Foreign Application Priority Data

Jul. 2, 1991 [JP] Japan .................................. 3-161578
Jul. 19, 1991 [JP] Japan .................................. 3-179108

[51] Int. Cl.$^6$ ........................................................ G03C 5/00
[52] U.S. Cl. ........................ 430/29; 430/5; 430/313; 430/314; 430/323; 430/324
[58] Field of Search ........................ 430/29, 23, 5, 430/313, 314, 323, 324

[56] References Cited

U.S. PATENT DOCUMENTS 4,861,422  8/1989  Kudou et al. ........................ 430/23
4,960,659  10/1990  Sagou ................................. 430/323
5,134,015  7/1992  Ohtake et al. ........................ 430/5

*Primary Examiner*—Mark Chapman
*Attorney, Agent, or Firm*—Dellett and Walters

[57] ABSTRACT

The present invention relates to a method for manufacturing a shadow mask, which is satisfactory in terms of shape, linearity and dimensional accuracy of an etching hole when thickness of an electrode base material is about 20–80 μm. According to the invention, resist is coated on both sides of a base material, and patterning is performed only on the resist on one side, the resist with electrode pattern is developed, and patterning is performed. The resist on the opposite side without electrode pattern is left all over the surface, and this is covered with a resin layer, which has anti-etching property, is resistible to spraying pressure during etching and has reinforcing property enough to maintain surface flatness of the base material to eliminate unstability of the base material by spraying pressure during etching, etching is performed only on one side of the base material from the patterned resist, and a shadow mask is obtained, which is satisfactory in shape, linearity and dimensional accuracy of the etching hole. The invention also discloses a method for forming an etching hole, which is dimensionally larger than the thickness of the electrode base material.

4 Claims, 4 Drawing Sheets

FIG.1A Cleaned up 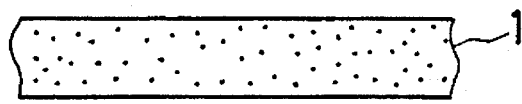
FIG.1B Resist coated 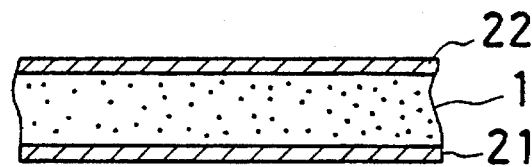
FIG.1C Pattern printed 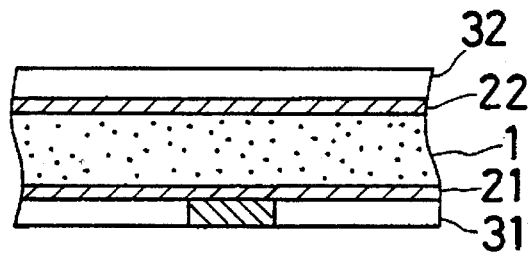
FIG.1D Developed 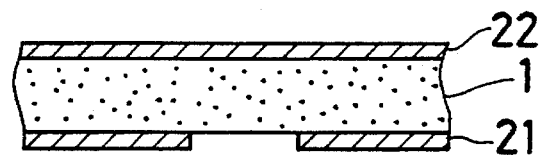
FIG.1E Reinforced 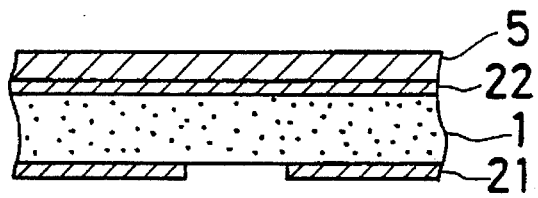
FIG.1F Etched 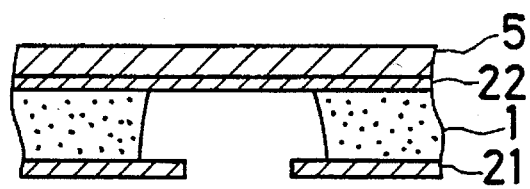
FIG.1G Removed 

FIG.2A Cleaned up 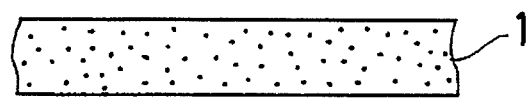
FIG.2B Resist coated 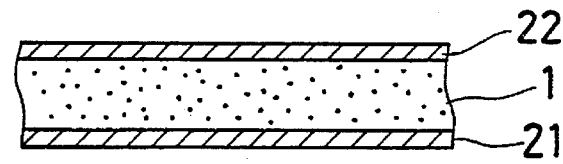
FIG.2C Pattern printed 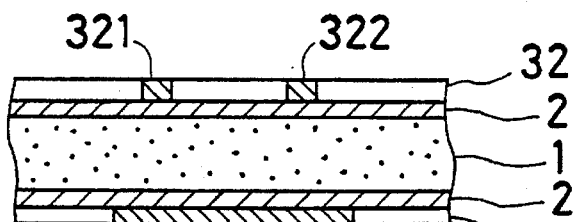
FIG.2D Developed 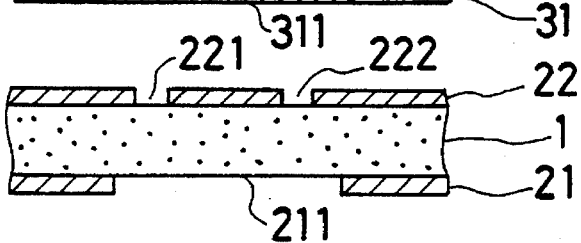
FIG.2E 1st etched 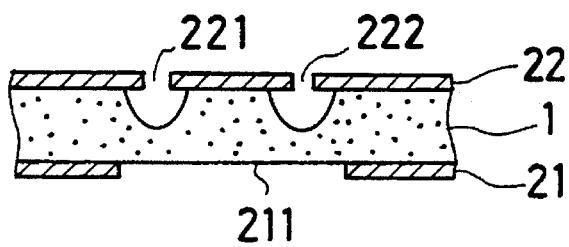
FIG.2F Filled 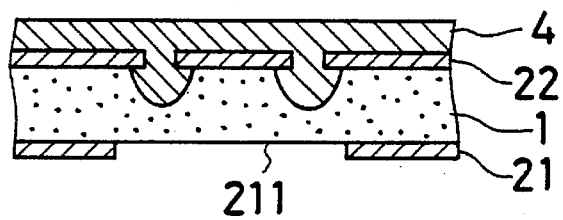
FIG.2G 2nd etched 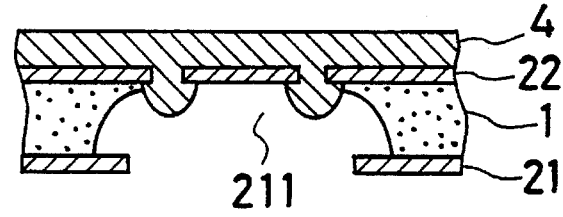
FIG.2H Removed 

FIG. 3A Cleaned up 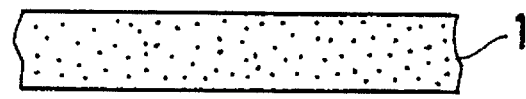
FIG. 3B Resist coated 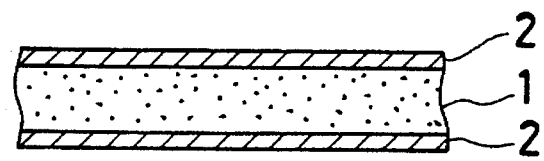
FIG. 3C Pattern printed 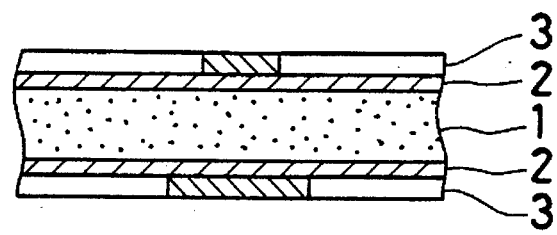
FIG. 3D Developed 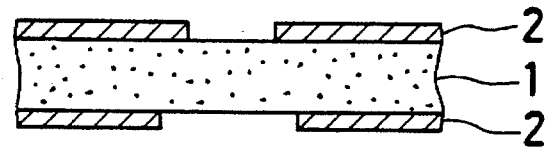
FIG. 3E Etched 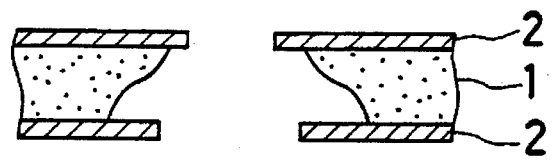
FIG. 3F Removed 

FIG. 4
FIG. 4A Cleaned up
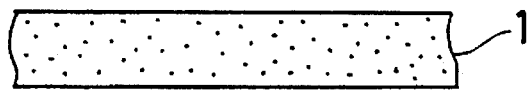
FIG. 4B Resist coated
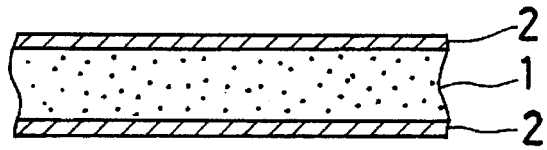
FIG. 4C Pattern coated
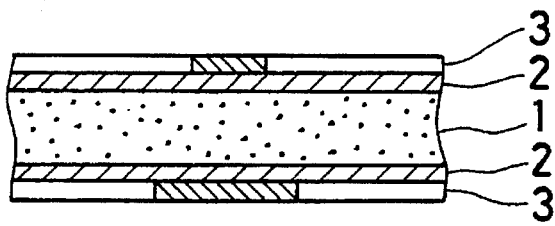
FIG. 4D Developed
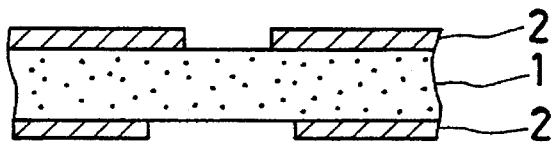
FIG. 4E 1st etched
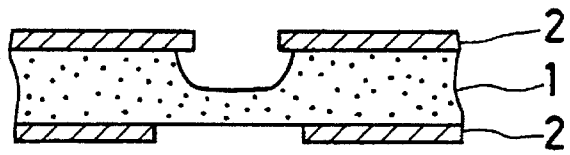
FIG. 4F Filled
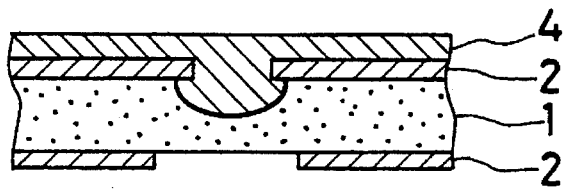
FIG. 4G 2nd etched
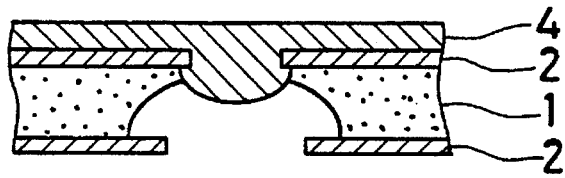
FIG. 4H Removed

METHOD FOR MANUFACTURING SHADOW MASK AND SHADOW MASK MANUFACTURED BY SAID METHOD

This is a divisional of application Ser. No. 07/908,194, filed on Jul. 1, 1992, now U.S. Pat. No. 5,348,825.

BACKGROUND OF THE INVENTION

The present invention relates to a method for manufacturing a shadow mask for color CRT, and in particular to a method for manufacturing a thin-plate shadow mask of 20–80 μm in thickness and to a shadow mask manufactured by said method, more specifically, an effective method for manufacturing a thin-plate type aperture grill in the form of slits.

With the recent increase of large-size CRT display units for color television and the like, there are now strong demands on large-size shadow masks. To produce lightweight shadow masks, thin plate of 20–80 μm in thickness is now widely used.

To manufacture a shadow mask of conventional type using a base material of 130–150 μm in thickness, an electrode base material 1 is cleaned up as shown in FIG. 3A, and resist 2 is coated on both surfaces of the base material 1 (FIG. 3B). Using a glass mask 3, the resist 2 on both surfaces is exposed to light (FIG. 3C). After developing the resist 2, patterning is performed, and an etching film is produced through baking (FIG. 3D). Then, etching is performed from both surfaces of the base material 1. After forming an opening (FIG. 3E), the resist 2 is removed (FIG. 3F). This is called one-step etching method- If this method is applied to thin plate material of 20–80 μm, surface flatness cannot be maintained because of spraying pressure during etching, and shape and dimensional accuracy of the etching hole thus completed are sometimes not satisfactory. There is another method, by which an electrode base material 1 is cleaned up (FIG. 4A), and resist 2 is coated on both surfaces of the base materials 1 as shown in FIG. 4B. Using a glass mask 3, the resist 2 on both surfaces is exposed to light (FIG. 4C). After developing the resist 2, patterning is performed, and an etching film is prepared through baking (FIG. 4D). Then, etching is performed only on one surface of the base material 1 to prepare a hole (FIG. 4E). An anti-etching packing material 4 is filled into this hole (FIG. 4F), and etching is performed again from the side opposite to the hole (FIG. 4G), and the resist 2 is removed (FIG. 4H). This is called two-step etching method. When this method is applied to thin plate base material of 20–80 μm, it is not possible to obtain cross-sectional shape as desired. The latter is disclosed in the Japanese Laid-Open Patent Publication No. 61-130492 and others.

When the thickness of the base material is as thin as 20–80 μm as described above, the plate thickness is relatively too thin to form an etching hole of 60–250 μm in width, and the desired cross-sectional shape cannot be prepared by the conventional two-step etching method as shown in FIGS. 4A–H. The etching hole penetrates the material before the desired cross-sectional shape is obtained.) By the one-step etching method shown in FIG. 3A–F, a product of good quality in terms of shape, linearity and dimensional accuracy of the etching hole cannot be obtained because the base material is too thin to have sufficient strength and surface flatness cannot be maintained during etching.

SUMMARY OF THE INVENTION

To solve the above problems, it is an object of the present invention to provide a shadow mask, which is satisfactory in terms of shape, linearity and dimensional accuracy of etching a hole when an electrode base material is 20–80 μm in thickness, and especially with a thin-plate type aperture grill.

Another object of the invention is to provide a shadow mask, in which an etching hole having a dimension larger than the thickness of the electrode base material, i.e. 20–80 μm, is formed with satisfactory linearity, dimensional accuracy and cross-sectional shape.

To attain the above objects, in a method for manufacturing a shadow mask according to the present invention, an electrode base material 1 of 20–80 μm in thickness is used as shown in FIGS. 1A–G, and the base material 1 is cleaned up as shown in FIG. 1 FIG. 1A. Then, resists 21 and 22 are coated on both surfaces of the base material 1 as shown in FIG. 1 FIG. 1B. Using a glass mask 31 with an electrode pattern, the resist 21 on one surface is exposed to light as shown in FIG. 1C, while the resist 22 on the other surface is exposed to light using a glass mask 32 without electrode pattern. Then, as shown in FIG. 1D, the resists 21 and 22 are developed, and patterning and drying are carried out to form an etching film. Thus, the resist 22 on the opposite side with no exposure of electrode pattern remains all over the surface. Next, as shown in FIG. 1E, the resist 22 on the unexposed portion is covered with a resin layer 5, which has anti-etching properties resistible to spraying pressure during etching and has strength enough to maintain surface flatness of the base material 1 to eliminate instability of the base material 1 caused by spraying pressure during etching. As shown in FIG. 1F, etching is performed only on one side of the base material from the side of the patterned resist 21, and the base material 1 is etched and penetrated. After etching is done as desired, the reinforcing resin layer 5 and the resists 21 and 22 are removed as shown in FIG. 1G. Thus, a shadow mask is obtained, which has satisfactory quality in terms of shape, linearity, and dimensional accuracy of the etching hole.

In FIG. 1E, reinforcing resin without anti-etching property may be used as the reinforcing resin layer 5 and may be covered with an anti-etching film. Further, instead of covering the reinforcing resin layer 5, a reinforcing adhesive film with the resist 22 on the unexposed side with anti-etching property may be used to cover it.

The resin layer 5 must have the above property, and it is preferably alkali-soluble. Solvent-soluble resin such as nitrocellulose type, novolak type, etc., UV-setting resin such as oligoester acrylate type, and hot melt resin such as rosin-polyester type may be used.

As for the above anti-etching film or reinforcing adhesive film with anti-etching property, there are anti-acid adhesive film such as polyester type or, polyethylene-polypropylene type. In this case, it is preferable to use an adhesive, whose adhesive strength is decreased by heat setting, heat foaming processing and ultraviolet ray irradiation for easier detachment.

Specifically, a first method for manufacturing a shadow mask of 20–80 μm in thickness of the present invention is characterized in that patterning is performed only on a resist layer on one side of an electrode base material, which is coated with resist layers on both surfaces, the resist layer coated on the other surface and without patterning is covered with a reinforcing resin layer with anti-etching property, etching is performed only on one side where the resist layer is patterned, and said base material is etched and penetrated.

A second method for manufacturing a shadow mask of 20–80 μm in thickness is characterized in that the resist layer coated on the other side without patterning is covered with a reinforcing resin layer, said resin layer is covered with an adhesive film with anti-etching property, etching is performed only on one side where resist layer is patterned, and said base material is etched and penetrated.

A third method for manufacturing a shadow mask of 20–80 μm in thickness is characterized in that patterning is performed only on a resist layer on one side of an electrode base material, which is coated with resist layers on both surfaces, a resist layer on the other side without patterning is covered with a reinforcing adhesive film with anti-etching property, and etching is performed only on one side where the resist layer is patterned, and said base material is etched and penetrated.

In the above manufacturing methods, it is preferable that the resin layer be made of alkali-soluble resin, and of solvent-soluble resin, UV-setting resin, hot melt resin, etc.

Further, it is preferable that the adhesive film be an anti-acid adhesive film. In this case, it is preferable to use an adhesive, whose adhesive strength is decreased by heat setting processing, heat foaming processing or ultraviolet irradiation.

A fourth method for manufacturing a shadow mask, which is a variant of the above methods, is characterized in that, on a steel plate of 20–80 μm in thickness, a through-hole which is dimensionally larger than steel plate thickness (3–5 times as thick as the plate) is formed by etching, a resist layer is coated on both surfaces of the steel plate, an opening of relatively large size matching the shape of the hole to be formed is patterned on a resist layer on the coated surface, one or more openings of relatively small size are patterned per each hole to be formed at least on one cross-section corresponding to edge shape of the hole to be formed, etching is performed from the rear side to a partial depth of the steel plate through a resist layer on rear side to form a hole, and a packing material with anti-etching property is filled into the hole, and a through-hole is formed by making a hole, which is communicated with a hole formed on rear side by etching the steel plate from the front surface through a resist layer on the front surface.

In this case, it is advantageous that the depth of the hole etched from rear surface is 50–60% of the thickness of the steel plate.

The present invention covers shadow masks manufactured by any of the above manufacturing methods.

Describing the function of the present invention, the first to the third manufacturing methods of the present invention, in which etching is performed from only one side with the patterned resist, are superior to the method to etch by one step from both surfaces of the base material of the same thickness in terms of shape and linearity of the etching hole. Because etching is performed from one side, the difference between the width of the resist pattern and the dimensional width of the through-hole of the product becomes larger. (This difference is referred as "etching compensation" hereinafter.) Thus, etching time is made relatively longer, and irregularities of the etching surface are flattened, resulting in better linearity. That is, the etching compensation is larger than with etching from both surfaces.

Because a reinforcing layer to maintain flatness of the base material is used to resist spraying pressure during etching and to eliminate instability of the base material by spraying pressure during etching, it is possible to manufacture a product with higher dimensional accuracy and better uniformity.

It may be probable to form an etching hole from the resist pattern side by attaching a reinforcing support member directly on the other surface where the resist layer is not coated. In this case, however, edge shape of the through-hole on the other surface becomes inferior because there is no resist layer on the other surface, and, the shape, linearity and dimensional accuracy of the etching hole is poorer. This not desirable. Further, the reinforcing support member is subject to heat treatment through resist coating, patterning and baking. As a result, thermal expansion and thermal contraction occur, and the shadow mask is deformed. Also, a force may be applied during detachment, and the shadow mask is also deformed. The deformation of the shadow mask leads to warping and distortion of the product, and this makes it difficult to manufacture the product with high dimensional accuracy and better uniformity. In contrast, in the first to the third manufacturing methods of the present invention, one surface of the electrode base material is covered, via a resist layer, with a resin layer with anti-etching and reinforcing properties, with a resin layer with reinforcing properties covered with an adhesive film with anti-etching properties, or with adhesive film with anti-etching and reinforcing properties. Thus, the edge shape of the through-hole on the other surface is formed better and it is possible to form an etching hole with better shape, linearity and dimensional accuracy. In case of the resin layer, it can be removed at the same time when the resist layer is removed by resist removing solution, and detaching force is not applied on the base material. Further, in case of the adhesive film, it is detached after heat setting processing, heat foaming processing or ultraviolet irradiation, and almost no physical force is applied on the base material. Therefore, the shadow mask is not deformed during detaching. The product is neither warped nor distorted, and it is possible to manufacture the product with higher dimensional accuracy and better uniformity.

In the fourth manufacturing method of the present invention, one or more openings of relatively small size are patterned per each hole to be formed on at least one cross-section corresponding to the edge shape of the hole to be formed on a resist layer, which is coated on the rear surface of the steel plate of 20–80 μm in thickness by a conventional two-step etching method. By the first-step etching, etching is performed from the rear surface through the resist layer on the rear surface to a depth so as not to penetrate the steel plate. Thus, a through-hole larger than the thickness of the thin steel plate can be formed by controlling cross-sectional shape. The diameter of the etching hole can be controlled by adjusting the distance between the openings. Further, etching time does not depend on the diameter of the hole to be formed, and it is possible to form the hole within the same time whether it is big or small.

Even in case of a thin steel plate of 20–80 μm in thickness, the shape and dimensional accuracy of etching hole are the same as in the case of the conventional two-step etching method.

Because a packing material with anti-etching property is filled through a resist layer in this case, the packing material can be removed at the same time when the resist layer is removed by a resist removing solution, and detaching force is not applied. Therefore, the shadow mask is not deformed, and it is possible to manufacture the product without warping or distortion, with high dimensional accuracy and better uniformity.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIGS. 1A–G represent a manufacturing process for an embodiment of the methods 1–3 for manufacturing a shadow mask of the present invention;

FIGS. 2A–H show a manufacturing process for an embodiment of the manufacturing method 4;

FIGS. 3A–F show a manufacturing process by conventional one-step etching from both sides; and FIGS. 4A–H represent a manufacturing process by conventional two-step etching method from both surfaces.

DESCRIPTION OF THE PREFERRED EMBODIMENTS

In the following, description will be given on the embodiments of the methods for manufacturing a shadow mask according to the present invention.

EXAMPLE 1

Using a base material of 14 inches in size and μm in thickness, made of low carbon mild steel, casein resist was coated on both sides of the base material. After drying, the resist on one side of the base material was patterned. It was baked, and rosin-polyester resin of hot melt type was coated on the resist surface on the other side in thickness of 200–500 μm. Then, the patterned side was etched by a spraying method using ferric chloride of 60° C. in liquid temperature and 46 Baume in specific gravity as an etching solution. Thus, a penetrating slit was prepared. After etching, it was washed with water. The resist and the resin were removed using alkaline solution. After washing and drying, width and linearity of the slit were measured. The results are compared with the result of a conventional one-step etching method in the table below.

| Manufacturing method | Dimensional accuracy σ | Linearity | |
| --- | --- | --- | --- |
| | | $R_z$ | $R_{max}$ |
| Conventional method | 0.20 | 1.09 μm | 1.28 μm |
| The present invention | 0.12 | 0.63 μm | 0.75 μm |

As it is evident from this table, compared with the conventional one-step etching method from both sides of the base material, dimensional accuracy and linearity were about two times better in the present invention.

Here, the dimensional accuracy σ is expressed by light transmittance of (several) slits in a limited region, and it is standard deviation for 100 pieces. $R_z$ and $R_{max}$ showing the linearity are defined by the Japanese Industrial Standard (JIS B 0601; 1982). The electrode plate was destroyed, and roughness of the cross-section was measured.

In this case, etching compensation of the resist pattern was set to 30 μm, and this was larger than the etching compensation in the conventional one-step etching from both sides. As the reinforcing resin, rosin-polyester resin was used. This has anti-etching property and is resistible to spraying pressure during etching and has the strength enough to maintain surface flatness of the base material. Preferably, it is alkali-soluble and easy to form on the resist.

Rosin-polyester resin used here melts at about 120° C., and it was coated on the resist in molten condition. After coating, the rosin-polyester resin is solidified in the range from normal temperature to etching temperature. It has sufficient reinforcing property, good anti-etching property and is alkali-soluble.

In the above example, the etching solution temperature was 60° C., and specific gravity of the etching solution was 46 Baume, while the same results were obtained when solution temperature was 50–75° C. and specific gravity was 45–49 Baume.

EXAMPLE 2

Description will be given now on an embodiment of the fourth manufacturing method of the present invention, referring to FIGS. 2A–H.

Using an electrode base material 1 of 20–80 μm in thickness and made of low carbon steel, the base material 1 was washed as shown in FIG. 2A. Then, resists 21 and 22 were coated on both sides of the base material 1 as shown in FIG. 2B. The resists 21 and 22 on both sides were exposed to an electrode pattern using glass masks 31 and 32 as shown in FIG. 2C. In this case, the front pattern plate 31 has one light shielding sector 311 (per each hole) corresponding to the diameter of the hole to be etched on the surface of the base material 1 as in the conventional two-step etching method. The rear pattern plate 32 has two light shielding sectors 321 and 322 at the portion corresponding to the edge of the hole to be formed from rear side of the base material, when seen in cross-section. Thus, if the hole formed on the base material 1 is a circular hole, the light shielding sectors 321 and 322 on the rear pattern plate 32 are in shape of rings matching the circumferential shape of the circular hole, when seen in plan view. If the hole to be formed on the base material 1 is a slot or a slit, the light shielding sectors 321 and 322 are two fine lines in parallel to both ends of the slot or the slit.

After exposure and printing of the front pattern plate 31 and the rear pattern plate 32, the resists 21 and 22 are developed and patterned. When baked, as shown in FIG. 2D, an opening 211 matching the light shielding sector 311 of the front pattern plate 31 is formed on the resist 21 of the front side, while the openings 221 and 222 matching the light shielding sectors 321 and 322 of the rear pattern plate 32 are formed on the resist of the rear side.

Then, etching is performed only on the rear side of the base material 1 as shown in FIG. 2E using the resist 22 on the rear side as an etching film, and holes matching the opening 211 and 222 are formed. That is, if the hole to be formed on the base material 1 is a circular hole, a concave hole like annular groove is formed. If the hole to be formed on the base material 1 is a slot or a slit, two concave holes in shape of linear groove are formed in parallel to the positions matching both ends of the slot or the slit. To maintain dimensional accuracy and cross-sectional shape of a through-hole by etching on a practical level, it is preferable that the depth of the concave hole from the rear side is about 50–60% of the thickness of the base material 1.

Then, as shown in FIG. 2F, a packing material with anti-etching property is filled into the holes. Etching is performed again from the front side, i.e. from the opposite side, through the opening 211 of the resist 21 to form a concave hole as shown in FIG. 2G. Thus, a through-hole of a desired shape is prepared.

Finally, as shown in FIG. 2H, the packing material 4 and the resists 21 and 22 are removed. As the result, a relatively large hole (3–5 times) compared the thickness of the base material 1 can be obtained with good cross-sectional shape, linearity and dimensional accuracy.

The diameter of the etching hole can be controlled by adjusting the distance between the openings 221 and 222. As is evident from the above opening process, etching time does not depend upon the diameter of the hole to be formed, and the hole can be formed within the same time whether it is big or small.

It is also possible to form one or more openings between the openings 221 and 222 so that etching remainder is left within the etching hole when a slot or a slit is formed.

As described above, it is possible according to the method of the present invention to manufacture a shadow mask with good shape, linearity and dimensional accuracy of etching hole from a thin base material of 20–80 μm in thickness. It is also possible to form a relatively larger through-hole compared with the thickness of steel plate within a short time on thin steel plate of 20–80 μm in thickness, such hole being satisfactory in shape, linearity and dimensional accuracy.

What we claim is:

1. A method for manufacturing a shadow mask, whereby a through-hole is formed on a steel plate of 20–80 μm in thickness and is dimensionally larger than the thickness of the plate, characterized in that resist layers are coated on front and rear sides of the steel plate, an opening of relatively large size matching the shape of the through-hole to be formed is patterned on the resist layer of the coated front side, and an opening of relatively small size which has two openings on at least one cross-section matching edge shape of the through-hole to be formed is patterned on the resist layer on the coated rear side, etching is performed to a partial depth of the steel plate from the rear side through the opening of the rear side resist layer, a packing material with anti-etching property is filled into the etched hole, etching is performed on the steel plate from the front side through the front side resist layer to form a hole communicating with the etched hole as formed on the rear side, and the packing material and resist layers are then removed to thus form the through-hole.

2. A method for manufacturing a shadow mask according to claim 1, wherein the through-hole to be formed is dimensionally 3 to 5 times larger than the thickness of the steel plate, and the partial depth of the hole to be etched from the rear side is 50–60% of the thickness of the steel plate.

3. A shadow mask manufactured by the manufacturing method according to claim 1.

4. A shadow mask manufactured by the manufacturing method according to claim 2.

* * * * *